BILATERAL ELECTRONIC SWITCHING CIRCUIT EMPLOYING LIGHT-SENSITIVE CONTROL ELEMENT AND FET INPUT
Filed May 20, 1966

INVENTOR.
WALTER C. THOMAS
BY J. M. Fernandez
ATTORNEY 3,467,836
Patented Sept. 16, 1969

3,467,836

BILATERAL ELECTRONIC SWITCHING CIRCUIT EMPLOYING LIGHT-SENSITIVE CONTROL ELEMENT AND FET INPUT

Walter C. Thomas, Richmond, Calif., assignor to Beckman Instruments, Inc., a corporation of California Filed May 20, 1966, Ser. No. 551,599
Int. Cl. H03k *17/60*
U.S. Cl. 307—249 6 Claims This invention relates to electronic switches and more particularly to an improved circuit for selectively controlling apparatus, such as in digital-to-analog converters, or for switching signals, such as analog signals in analog computers.

Analog computers having percise repetitive or iterative control features require electronic switches to control, for example, the various modes of an integrator as well as to switch analog signals in various problem configurations. Early computers of this type utilized high-speed relays for control and signal switching. While this type of control was satisfactory for the lower iteration rates of earlier analog computers, the pick-up, drop-out, differential and bounce times caused significant errors in computation of more recent, higher iteration rate computers made possible with the advent of solid state circuits. The higher iteration rates also reduced the lifetime and reliability of the relay switches. Therefore, a faster and more reliable switch was needed for the more recent computers.

Various semiconductor switching circuits have been devised in the past for digital computers and more recently for analog computers. However, these circuits have proven to be inadequate for analog computers. The need in analog computers is for a semiconductor switching circuit compatible in accuracy and interchangeability with relay switches for analog computer control and analog signal switching at a reasonable cost. Although semiconductor switching circuits are faster, most of those known heretofore introduce errors not found in relay switches because semiconductor devices introduce offset voltages, undesired coupling of control signals, current leakage, and undesired internal resistance. In addition, some designs even introduce switching transients, switching delays and variations or differentials in switching delays. Some or all of those previously available switching circuits have limited performance in many applications such as in digital-to-analog converters, multiplexers for scanning current or voltage signal sources, and analog computers for various functions including switching for the purpose of generating a function or for the mode control of an integrator.

Accordingly, the primary object of this invention is to provide a faster and more reliable semiconductor switching circuit than has been available heretofore. Another object is to provide an improved semiconductor switching circuit having an isolated power supply to replace relay switches.

These and other objects of the invention are achieved by providing a bilateral semiconductor switch having one electrode adapted to be connected to a signal source, another electrode adapted to be connected to a load or current node of a circuit, and a pair of control electrodes so coupled to a control signal as to cause current of either polarity to be selectively conducted depending solely upon the polarity of a control signal applied thereto. The control electrodes of the transistor switch are preferably coupled to a control signal by a high input impedance, field-effect transistor having its source electrode connected to one control electrode and its drain electrode coupled to the other control electrode of the bilateral transistor switch. Operating bias for the bilateral transistor switch is provided by series connected photovoltaic cell in the control circuit. The cell is optically coupled to a suitable source of light. The gate electrode of the field-effect transistor is adapted to receive the control signal and in response thereto, to turn the bilateral transistor switch on. In that manner, the bilateral transistor switch is operated to selectivley couple the signal source to a load or current node through a low impedance path with isolation of the signal from the control circuit and power supply.

A complete understanding of these and other objects of the invention may be obtained from the following description with reference to the accompanying drawing in which.

Figure 1:
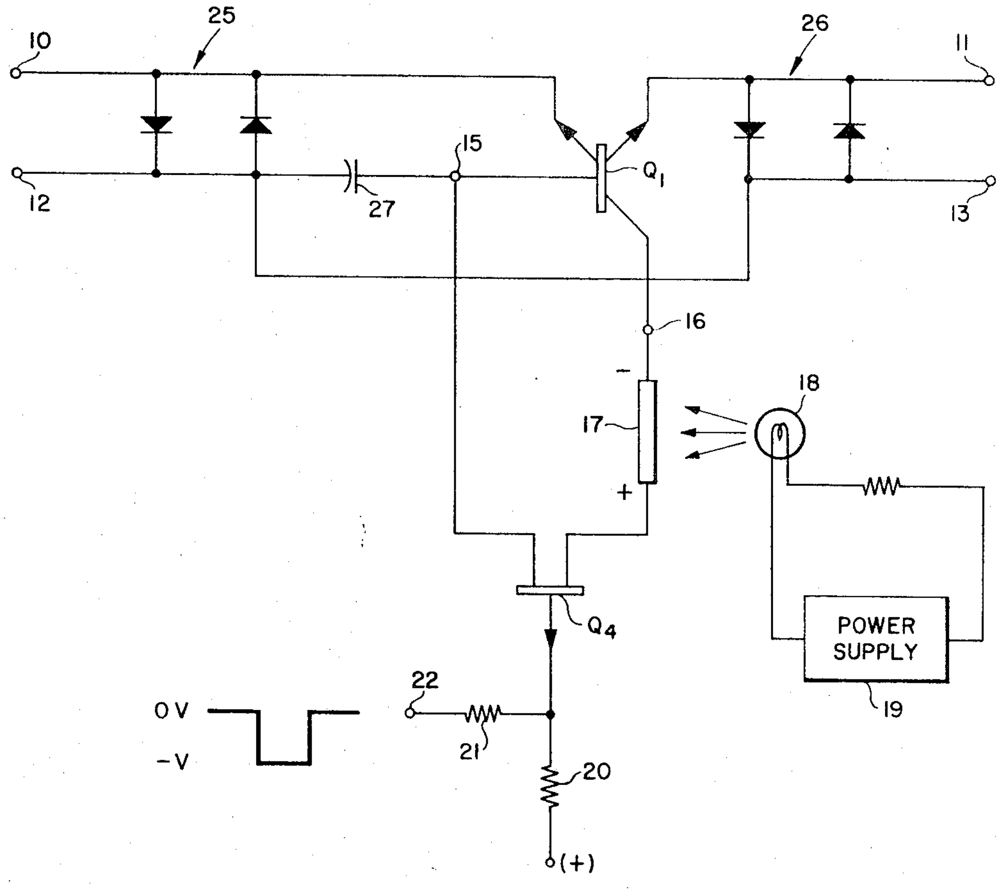
FIGURE 1 illustrates a schematic diagram of one illustrative embodiment.

Referring now to FIGURE 1 the illustrative embodiment therein depicted comprises a bilateral semiconductor switch $Q_1$ for selectively connecting an input terminal to an output terminal 11 for the purpose of selectively connecting a signal source connected between the input terminal 10 and a signal current ground terminal 12 to a load (or current node, such as the summing junction of an operational amplifier) connected between the output terminal 11 and signal current ground terminal 13. It should be noted that the second signal current ground terminal 13 is directly connected to the first signal current ground terminal 12 in order to isolate the signal current from other ground currents in the system employing this invention.

The bilateral semiconductor switch $Q_1$ is preferably a dual-emitter silicon planar semiconductor device designated Type 3N71 (Sperry) and designed primarily for saturated switching service in the inverted connection for low-level signal switching applications. The device has a maximum offset saturation voltage between its emitters of 50 microvolts, and a maximum saturation resistance between its emitters of 15 ohms with a base current of 2 milliamperes. It also exhibits an off resistance between its emitters of greater than $10^{12}$ ohms as used in the present invention. Other semiconductor devices similar in nature can be employed with a possible modification of the over-all switching circuit specifications. For instance, if low-level signal switching is not involved, a semiconductor device may be employed without inverted connections such that collector electrodes would be connected to the terminals 10 and 11 instead of emitters.

Figure 2:
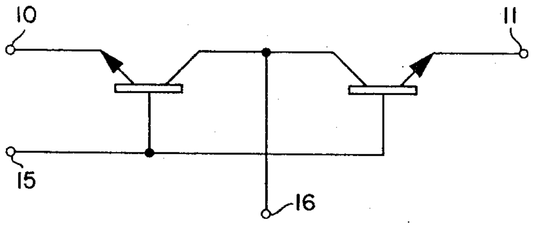
FIGURE 2 is a schematic diagram of a bilateral semiconductor switch which conducts current of either polarity.

The bilateral semiconductor switch $Q_1$ is equivalent to the circuit illustrated in FIGURE 2 so that in place of the dual-emitter silicon planar semiconductor device $Q_1$, two discrete transistors may be employed, although the silicon planar semiconductor device is preferred in order to avoid some of the problems which may be encountered in the use of two discrete transistors, such as temperature drift. In other words, the circuit of FIGURE 2 produced as an integrated circuit is preferred for the semiconductor device $Q_1$ in the circuit of FIGURE 1.

In operation of the circuit of FIGURE 2, when the base-collector junction of two transistors $Q_2$ and $Q_3$ are both biased in the forward direction, both transistors will conduct current in either direction. Conversely, if both base-collector junctions are reverse biased, both transistors are cut off. In order to forward bias, or reverse bias, the two transistors simultaneously, the base electrodes of the two transistors are connected to a first control terminal 15 and the collector electrodes are connected to a second control terminal 16. The corresponding pair of control terminals associated with the bilateral semiconductor switch $Q_1$ in FIGURE 1 are identified by the same reference numerals 15 and 16. Similarly, the input and output terminals of the circuit illustrated in FIGURE 1 are shown in the circuit diagram of FIGURE 2 and illustrated by the same reference numerals to facilitate a complete understanding of how the circuit of FIGURE 2 is employed in the illustrative embodiment of the invention shown in FIGURE 1.

A field-effect transistor $Q_4$ is connected to the control terminals 15 and 16 to control the bilateral semiconductor switch $Q_1$. In this embodiment, the source and drain electrodes of the field-effect transistor are therefore connected to the base and collector electrodes of the bilateral semiconductor switch respectively, the drain electrode connection being through a photovoltaic cell 17 so connected as to provide a source of bias potential of the polarity indicated in response to illumination from a suitable source of light, such as an incandescent lamp 18 connected to a power supply 19. In that manner a forward biasing potential for the semiconductor switch $Q_1$ is connected between the control termials 15 and 16 and when the field-effect transistor $Q_4$ is switched into conduction to provide a low impedance path between its source and drain electrodes.

The field-effect transistor $Q_4$ is an enhancement mode insulated gate field-effect transistor of the type FN1034 (Raytheon) having a P-type channel and an N-type substrate. This device is designed for application featuring the zero offset, high input impedance, and low internal impedance between its source electrode and drain electrode when it is switched into conduction. When switched into conduction, the channel resistance is in the order of 200 ohms, whereas when switched off, the channel resistance is greater than $10^{10}$ ohms. The input resistance of the device is in the order of $10^{15}$ ohms, thereby providing isolation between the base-collector circuit of the bilateral semiconductor switch $Q_1$ and the control circuit connected to the gate electrode comprising resistors 20 and 21. Other types of field-effect transistors may, of course, be employed, and for the practice of one aspect of the invention, still other types of switching devices may be employed which exhibit high input impedance to isolate the signal being switched by the semiconductor switch. Still another type of switch may be employed to selectively turn the lamp 18 on to turn the semiconductor switch on and thereby connect the input terminal 10 to the output terminal 11, in which case the positive terminal of the cell 17 is connected directly to the control terminal 15.

In operation, a control signal which is normally at a zero voltage level is applied to an input terminal 22 to bias the gate of the field-effect transistor $Q_4$ at about +1.6 volts, thereby to maintain current from the source to the drain thereof cut off and the bilateral semiconductor switch $Q_1$ cut off. To turn the switch $Q_1$ into conduction, the control voltage applied to the terminal 22 is changed to a negative voltage level, thereby to provide a voltage to the gate electrode of the field-effect transistor $Q_4$ at approximately −7.3 volts and cause it to conduct. In that manner, a base-collector bias is provided for the semiconductor switch $Q_1$ to cause it to conduct current in either direction.

Diode limiters 25 and 26 are connected between the signal current ground and the input and output terminals 10 and 11, respectively, in order to protect the bilateral semiconductor switch $Q_1$ against damage due to signal transients. A capacitor 27 is connected between the control terminal 15 and signal current ground to provide a low impedance path to signal current ground for high-frequency noise.

While the principles of the invention have now been made clear in an illustrative embodiment, obvious modifications particularly adapted for specific applications, environments and operating requirements may be made without departing from those principles. The appended claims are therefore intended to embrace any such modifications.

What is claimed is:

1. A switching circuit for selectively connecting an output terminal to an input terminal comprising a bilateral semiconductor switch having a first electrode connected to said input terminal, a second electrode connected to said output terminal, and other electrodes connected to a pair of control terminals, a source of bias potential including a photovoltaic cell connected in series between said control terminals of said semiconductor switch and a source of light optically coupled thereto, the polarity and amplitude of said bias potential being so selected as to provide a bias current for establishing a low impedance state in said bilateral semiconductor switch between said input and output terminals, control means for interrupting said bias current in response to a control signal, and means coupling a control signal to said control means whereby said bias current may be controlled to selectively connect said output terminal to said input terminal.

2. A switching circuit as defined in claim 1 wherein said control means comprises a field-effect transistor having a pair of ohmic electrodes connected in series with said source of bias potential between said pair of control terminals of said bilateral semiconductor switch.

3. A switching circuit as defined in claim 1 wherein said bilateral semiconductor switch comprises a dual emitter transistor device having one of said emitters connected to said output terminal, the other of said emitters connected to said input terminal and other electrodes connected to said pair of control terminals.

4. A switching circuit as defined in claim 1 wherein said bilateral semiconductor switch comprises a device having a pair of three-electrode, junction transistors, said transistors being of like conductivity type, the base electrode of each being connected to one of said pair of control terminals, like electrodes of each being connected to the other one of said pair of control terminals, and the remaining electrode of each being connected to a different one of said input and output terminals.

5. A switching circuit as defined in claim 2 wherein said bilateral semiconductor switch comprises a dual emitter transistor device having one of said emitters connected to said output terminal, the other of said emitters connected to said input terminal, and other electrodes connected to said pair of control terminals.

6. A switching circuit as defined in claim 2 wherein said bilateral semiconductor switch comprises a device having a pair of three-electrode, junction transistors, said transistors being of like conductivity type, the base electrode of each being connected to one of said pair of control terminals, like electrodes of each being connected to the other one of said pair of control terminals, and the remaining electrode of each being connected to a different one of said input and output terminals.

References Cited

UNITED STATES PATENTS

| | | | |
|---|---|---|---|
| 3,066,258 | 11/1962 | Van Overbeck et al. | 307—249 |
| 3,322,968 | 5/1967 | Dennis | 307—249 |
| 3,418,480 | 12/1968 | Miller | 307—311 |

ARTHUR GAUSS, Primary Examiner

ROBERT H. PLOTKIN, Assistant Examiner

U.S. Cl. X.R.

307—251, 311